(12) United States Patent
Okino et al.

(10) Patent No.: US 6,228,552 B1
(45) Date of Patent: *May 8, 2001

(54) PHOTO-SENSITIVE MATERIAL, METHOD OF FORMING A RESIST PATTERN AND MANUFACTURING AN ELECTRONIC PARTS USING PHOTO-SENSITIVE MATERIAL

(75) Inventors: Takeshi Okino, Yokohama; Koji Asakawa; Naomi Shida, both of Kawasaki; Toru Ushirogouchi, Yokohama; Makoto Nakase, Tokyo, all of (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 08/927,411

(22) Filed: Sep. 10, 1997

(30) Foreign Application Priority Data

Sep. 13, 1996 (JP) .................................................. 8-243786

(51) Int. Cl.$^7$ .......................... G03F 7/021; G03F 7/023; G03F 7/30; G03F 7/38
(52) U.S. Cl. ...................... 430/176; 430/170; 430/175; 430/191; 430/192; 430/193; 430/165; 430/270.1; 430/325; 430/326; 430/328
(58) Field of Search ..................... 430/191, 192, 430/193, 165, 270.1, 326, 328, 325, 170, 175, 176

(56) References Cited

U.S. PATENT DOCUMENTS

| | | | |
|---|---|---|---|
| 4,106,943 | * | 8/1978 | Ikeda et al. ........................... 430/197 |
| 4,493,884 | * | 1/1985 | Nagano et al. ....................... 430/192 |
| 4,571,375 | * | 2/1986 | Benedikt ............................. 430/197 |
| 4,650,741 | * | 3/1987 | Miura et al. ......................... 430/192 |
| 4,678,737 | * | 7/1987 | Schneller et al. .................. 430/270.1 |
| 4,725,523 | * | 2/1988 | Miura et al. ......................... 430/192 |
| 5,210,000 | * | 5/1993 | Thackeray et al. .................. 430/165 |
| 5,316,884 | * | 5/1994 | Toukhy ................................ 430/165 |
| 5,368,977 | * | 11/1994 | Yoda et al. .......................... 430/192 |
| 5,403,695 | * | 4/1995 | Hayase et al. ..................... 430/270.1 |
| 5,478,692 | | 12/1995 | Doi et al. ............................. 430/192 |
| 5,529,880 | | 6/1996 | Zampini et al. ..................... 430/190 |
| 5,707,776 | * | 1/1998 | Kawabe et al. .................... 430/270.1 |
| 5,723,253 | * | 3/1998 | Higashino et al. .................. 430/166 |
| 5,728,504 | * | 3/1998 | Hosoda et al. ...................... 430/165 |
| 5,738,975 | * | 4/1998 | Nakano et al. .................... 430/270.1 |
| 5,837,419 | * | 11/1998 | Ushirogouchi et al. .......... 430/270.1 |
| 5,863,699 | * | 1/1999 | Asakawa et al. ................. 430/270.1 |
| 5,932,391 | * | 8/1999 | Ushirogouchi et al. ............. 430/905 |

FOREIGN PATENT DOCUMENTS 8-82925    3/1996  (JP) .

* cited by examiner

*Primary Examiner*—John S. Chu
(74) *Attorney, Agent, or Firm*—Oblon, Spivak, McClelland, Maier & Neustadt, P.C.

(57) ABSTRACT

A photosensitive material, which comprises, an alkali-soluble resin moiety having an alicyclic skeleton, a polycyclic condensation skeleton, or both alicyclic and polycyclic condensation skeletons, and a diazo compound moiety. The diazo compound moiety may be contained in a side chain of the alkali-soluble resin moiety or included in the photosensitive material in separate from the alkali-soluble resin moiety.

19 Claims, 2 Drawing Sheets

PHOTO-SENSITIVE MATERIAL, METHOD OF FORMING A RESIST PATTERN AND MANUFACTURING AN ELECTRONIC PARTS USING PHOTO-SENSITIVE MATERIAL

BACKGROUND OF THE INVENTION

This invention relates to a photosensitive material which is useful for a fine working in the manufacture of a semiconductor element, a TFT (thin film transistor), a photo-disk, etc.

In the manufacture of electronic devices such as an LSI, a fine working technique utilizing a photo-lithography has been employed. In this fine working technique, a resist film is first formed by coating a resist solution onto a semiconductor substrate for instance. The resist film thus formed is then exposed to light through a prescribed mask pattern, and subsequently subjected to various treatments including an alkali-development, thereby forming a resist pattern. This resist pattern is then utilized as an etch resistant mask in a dry etch process, and the exposed portions of the substrate are etched away to form a pattern of fine line or window thereby obtaining a desired pattern. Finally, the resist pattern remaining on the substrate is removed through ashing.

Therefore, the resist to be employed in this process is generally required to have a high dry etch resistance. In view of this requirement, a resist comprising an aromatic compound has been extensively employed. For example, many kinds of resists comprising an alkali-soluble novolak resin as a base resin have been developed up to date.

In view of a trend in recent years to further increase the integration of semiconductor elements such as seen in an LSI, the aforementioned fine working technique in recent years has made it possible to realize a fine pattern of the order of sub-half micron. It is expected that this trend to further increase the integration of semiconductor elements becomes more prominent in future. In order to meet such a trend, the use of light source of shorter wavelength in photolithography is now being studied. For example, a method for forming a finer resist pattern through the use of ArF excimer laser (193 nm in wavelength) or the quintuple harmonic of YAG laser (218 nm in wavelength) has been tried at present.

However, the aforementioned conventional resist comprising a novolak resin as a base resin generally exhibits a high light absorption to the aforementioned light of short wavelength at the benzene nucleus of the novolak resin. Therefore, it is impossible, because of the high light absorption, to allow the exposure light to reach deep enough to an interface between the resist film and the substrate, thus making it very difficult to form, with high sensitivity, a fine pattern which is excellent in shape of pattern and in precision.

As one of the methods of forming a pattern, a method called PCM (portable comformable mask) method has been set forth by B. J. Lin in Proc. SPIE. 174, 114. According to this patterning method, a resist pattern is formed as an upper layer, and an underlying layer is collectively exposed using the resist pattern as a mask. One example employing this PCM method is reported by A. W. McCullough et al in Proc. SPIE. 631, 316, 1986. According to this document, PMGI (polydimethyl glutarimide) was employed as an underlying material and collectively exposed and patterned using as a mask an upper layer formed of novolak naphthoquinone diazide.

According to the aforementioned PCM method, even an underlying layer can be patterned by way of an exposure/development process in the transcription of pattern, so that the PCM method is advantageous in the respect that the generation of dust called scum as seen in the case of transcribing a pattern to an underlying layer by means of etching can be suppressed. Beside this PCM method, there have been proposed various kinds of PCM method. However, according to the conventional PCM methods, a photosensitive material employed for the underlying layer is, in most cases, relatively low in dry etch resistance as compared with the ordinary phenol resin, thus making it difficult to put these conventional PCM methods into practical use. In the case of the aforementioned method proposed by A. W. McCullough et al, novolak naphthoquinone diazide which is usually employed in a lithography using a mercury lamp is employed as a photosensitive material for an upper layer, while PMGI which is usually employed in a lithography using KrF excimer laser beam which wavelength is shorter than that of the mercury lamp is employed as a photosensitive material for a lower layer. Accordingly, the exposure light of relatively longer wavelength is employed for forming a pattern in the upper layer, thus rendering the method disadvantageous in terms of forming an optically fine pattern. Moreover, since there is actually a problem of an interlayer mixing in the lamination of a plurality of photosensitive layers, it has been very difficult to form a fine pattern.

As mentioned above, since the resist comprising a novolak resin as a base resin is insufficient in transparency to the light of short wavelength in spite of its excellent dry etch resistance and alkali-developing properties, there has been a strong demand for the development of a new resist which is suited for use in a photolithography where the ArF excimer laser or the quintuple harmonics of YAG laser is employed.

In view of this, a resist where an alicyclic compound is employed in place of an aromatic compound is recently attracting many attentions. For example, a resist comprising a polymer having an adamantine skeleton as a base resin thereof is proposed in Japanese Patent Unexamined Publication Hei/4-39665 as being excellent in dry etch resistance and in transparency to a light of short wavelength. This patent publication also discloses an example where a compound having an adamantine skeleton is copolymerized with an acrylic compound having a carboxylic group to provide a copolymer having an alkali-solubility, thereby making it possible to form a resist pattern with an alkaline developing solution.

However, various problems will be encountered in a process of forming a resist pattern through an alkaline development of a resist comprising an alicyclic compound, because the alkali-solubility of an alicyclic structure such as the adamantine skeleton differs greatly from that of carboxylic group. For example, the solubility and removal of a given region of a resist film may become non-uniform at the occasion of development, thereby inviting not only the deterioration of resolution, but also the generation of cracks or surface roughening of a resist film portion which should have been kept unremoved due to a partial solution of the resist film portion. Moreover, an alkali solution may penetrate into an interface between the resist film and the substrate, thereby causing a peeling of the resist pattern, thus failing to assure a sufficient adhesion of the resist. Additionally, a phase separation between the alicyclic structure portion and the carboxylic group portion may be readily proceeded, thus making it difficult to prepare a homogeneous resist solution and to obtain a resist solution having a satisfactory coating property.

There has been also developed, as a highly sensitive resist, a chemical amplification type resist utilizing a catalytic effect of an acid. However, this chemical amplification type resist is vulnerable to the influence during a time period between the exposure and the PEB. In particular, due to an influence by the amine contained in the air atmosphere, the shape of resist pattern to be obtained may be deteriorated, so that under some circumstances, it may result in a peeling of the resist pattern from the substrate.

Furthermore, as mentioned above, according to the conventional PCM method, the photosensitive material for the upper layer is constituted by a material to be employed in a lithography employing a light whose wavelength is longer than that to be employed in a lithography for treating the underlying layer, thus rendering the method disadvantageous in terms of forming an optically fine pattern.

BRIEF SUMMARY OF THE INVENTION

Therefore, the object of the present invention is to provide a photosensitive material, which is excellent in environmental stability, excellent in transparency to the light of short wavelength, and capable of forming a fine resist pattern which is high in resolution and in adhesivity to the substrate by making use of an alkaline development.

Another object of this invention is to provide a practical method of forming a pattern, which makes use of the PCM method and is characterized in the employment, as an upper layer, of a material having three features, i.e. a feature which enables to employ a light of as short as 193 nm or an electron beam, a feature of having a high absorption wavelength band which allows the material to be used as a mask in the exposure of the underlying layer, and a feature which hardly allows a mixing between the material and the underlying film.

Another object of this invention is to provide a method of manufacturing electronic parts, which make it possible to accurately perform a fine working by making use of a pattern.

According to this invention, there is provided a photosensitive material, which comprises; an alkali-soluble resin moiety having an alicyclic skeleton, a polycyclic condensation skeleton, or both alicyclic and polycyclic condensation skeletons; and a diazo compound moiety.

According to this invention, there is further provided a method of forming a pattern, which comprises the steps of; forming a film containing a photosensitive material, which comprises; an alkali-soluble resin moiety having an alicyclic skeleton, a polycyclic condensation skeleton, or both alicyclic and polycyclic condensation skeletons; and a diazo compound moiety; exposing a predetermined portion of the film of photosensitive material to an actinic radiation; and developing an exposed portion or an unexposed portion of the film of photosensitive material by dissolving the exposed or unexposed portion with an aqueous alkaline solution.

According to this invention, there is further provided a method of forming a pattern, which comprises the steps of; forming an underlying layer of photosensitive material on a substrate; forming an upper layer of photosensitive material having a structure containing a substituted or unsubstituted polycyclic condensed aromatic ring on the underlying layer of photosensitive material; selectively exposing a portion of the upper layer of photosensitive material to a first actinic radiation; developing the upper layer of photosensitive material by dissolving an exposed or unexposed portion with an aqueous alkaline solution to form a patterned upper layer of photosensitive material; and irradiating a second actinic radiation having a wavelength longer than that of the first actinic radiation to the underlying layer of photosensitive material using the pattern as a mask, and developing the underlying layer of photosensitive material by dissolving and removing an exposed portion selectively, thus transcribing the patterned upper layer of photosensitive material to the underlying layer of photosensitive material.

According to this invention, there is further provided a method of forming a pattern, which comprises the steps of; forming an underlying layer of photosensitive material on a substrate; forming an upper layer of photosensitive material having a structure containing a substituted or unsubstituted benzen ring or polycyclic condensed ring on the underlying layer of photosensitive material; selectively exposing a portion of the upper layer of photosensitive material to electron beam; developing the upper layer of photosensitive material by dissolving an exposed or unexposed portion with an aqueous alkaline solution to form a patterned upper layer of photosensitive material; and irradiating a light of 190 to 260 nm in wavelength to the underlying layer of photosensitive material using the pattern as a mask, and developing the underlying layer of photosensitive materiel by dissolving and removing an exposed portion of the underlying layer of photosensitive material, thus transcribing the patterned upper layer of photosensitive material to the underlying layer of photosensitive material.

According to this invention, there is further provided a method of manufacturing electronic device, which comprises the steps of; forming a film containing a photosensitive material, which comprises; an alkali-soluble resin moiety having an alicyclic skeleton, a polycyclic condensation skeleton, or both alicyclic and polycyclic condensation skeletons; and a diazo compound moiety; exposing a predetermined portion of the film of photosensitive material to light; forming a photosensitive material pattern by dissolving an exposed portion of the film of photosensitive material with an aqueous alkaline solution; and transcribing a pattern on the substrate by an employment of the photosensitive material pattern as an etching mask.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1A:
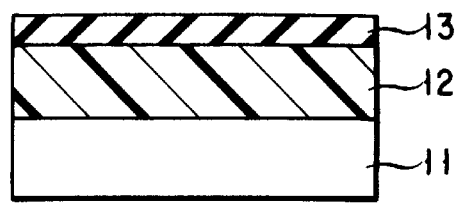
FIGS. 1A to 1F illustrate sectional views schematically showing the process of forming a resist pattern according to one example of this invention.

This invention will be further explained as follows.

As for the examples of the aforementioned alkali-soluble resin to be employed in the photosensitive material of this invention, a copolymer comprising acrylic acid or methacrylate for instance may be employed. Specific examples of these resins are a copolymer consisting of menthylmethacrylate, methylmethacrylate and methacrylic acid; a copolymer consisting of vinylnaphthalene, menthylacrylate, methylmethacrylate and methacrylic acid, etc.

Since the alkali-soluble resins to be employed in this invention have an alicyclic skeleton or a polycyclic condensation skeleton, it is advantageous not only in that the resin exhibits an excellent transparency at a wavelength of 193 nm, but also in that a resist pattern to be obtained would be provided with a high dry etch resistance.

As for the aforementioned alicyclic skeleton, a cyclic compound represented by a general formula $C_nH_{2n}$ (n is an integer of 3 or more), bicyclic compound and condensed rings of these cyclic compound can be employed. Specific examples thereof include cyclobutane; cyclopentane; cyclohexane; cycloheptane; any of above-mentioned monocyclic compounds attached with a bridging hydrocarbon; a spiro ring such as spiroheptane or spirooctane; a terpene ring such as norbornyl, adamanthyl, bornene, menthyl or menthane; a steroid skeleton such as thujane, sabinene, thujone, carane, carene, pinane, norpinane, bornane, fenchane, tricyclene or cholesteric ring; bile acid; digitaloid; camphoric ring; isocamphoric ring; sesquiterpene; santonic ring; diterpene; triterpene; and steroidsaponin. Among them, the compounds having a substituted or unsubstituted menthyl group is most preferable, since these compounds are natural substances and unharmful to the environment.

On the other hand, examples of the alkali-soluble resin having a polycyclic condensation skeleton are indene, indane, benzobuldene, 1-indanone, 2-indanone, 1,3-indadione, ninhydrine, naphthalene, methylnaphthalene, ethylnaphthalene, dimethylnaphthalene, cadalene, vinylnaphthalene, 1,2-dihydronaphthalene, 1,4-dihydronaphthalene, 1,2,3,4-tetrahydronaphthalene tetralin, 1,2,3,4,5,6,7,8-octahydronaphthalene, cis-decalin, trans-decalin, fluoronaphthalene, chloronaphthalene, bromonaphthalene, iodonaphthalene, dichloronaphthalene, (chloromethyl)naphthalene, 1-naphthol, 2-naphthol, naphthalenediol, 1,2,3,4-tetrahydro-1-naphthol, 1,2,3,4-tetrahydro-2-naphthol, 5,6,7,8-tetrahydro-1-naphthol, 5,6,7,8-tetrahydro-2-naphthol, decahydro-1-naphthol, decahydro-2-naphthol, chloronaphthol, nitronaphthol, aminonaphthol, methoxynaphthalene, ethoxynaphthalene, naphthyl ether, naphthyl acetate, naphthoaldehyde, naphthalenedicarbaldehyde, hydroxynaphthoaldehyde, dinaphthyl ketone, 1(2H)-naphthalene, α-tetralone, β-tetrarone, α-decarone, β-decarone, 1,2-naphthoquinone, 1,4-naphthoquinone, 2,6-naphthoquinone, 2-methyl-1,4-naphthoquinone, 5-hydroxy-1,4-naphthoquinone, isonaphthazarin, naphthoic acid, 1-naphthol-4-carboxylic acid, naphthalic acid, naphthalic anhydride,. 1-naphthyl acetate, thionaphthol, N,N-dimethylnaphthyl amine, naphthonitrile, nitronaphthalene, pentalene, azulene, heptalene, fluorene, 9-phenyl fluorene, nitrofluorene, 9-fluorenol, fluorenone, anthracene, methylanthracene, dimethylanthracene, 9,10-dihydroanthracene, anthrol, anthranol, hydroanthranol, dihydroxyanthracene, anthragallol, 1(4H)-anthracenone, anthrone, anthrarobin, crysalobin, oxanthrone, anthracene carboxylic acid, anthramine, nitroanthracene, anthracenequinone, anthraquinone, methylanthraquinone, hydroxyanthraquinone, phenanthrene, phenanthrol, phenanthrenehydroxyquinone, phenanthraquinone, biphenylene, s-indacene, as-indacene, phenalene, tetracene, chrysene, 6-chrysoquinone, pyrene, 1,6-pyrenequinone, triphenylene, benzo[α]anthracene, benzo[α]anthracene-7,12-quinone, benzanethrone, aceanthrylene, acephenanthrylene, acephenanthrene, 17H-cyclopenta[α]phenanthrene, fluoranthene, pleiadene, pentacene, pleiadene, pentacene, pentaphene, picene, pirylene, dibenzo[a, j]anthracene, benzo[α]pyrene, coronene, pyranthrene, and pyranthrone.

Generally, the absorption band of these polycyclic condensation skeletons is also shifted from the absorption band of benzene nucleus so that it does not exhibit a high absorption in the short wavelength region. Therefore, it is possible, when the alkali-soluble acrylic resin is constituted to include any of these skeletons, to provide a photosensitive material which is capable of forming a resist pattern excellent in dry etch resistance.

It is possible to utilize the photosensitive material of this invention for an evaluation of the optical characteristics of ArF excimer laser, etc. Therefore, if the resist pattern to be obtained from the employment of the photosensitive material of this invention is not used as an etching mask, it is not required to provide the alkali-soluble resin with an alicyclic skeleton, naphthalene skeleton or anthracene skeleton.

If the alkali-soluble resin is to be provided with an alicyclic skeleton according to this invention, the resin can be easily manufactured by polymerizing a polymerizable compound having in its molecule a polymerizable double bond and an alicyclic structure containing an acidic substituent group by way of radical polymerization, cationic polymerization or anionic polymerization, or in the presence of a Ziegler-Natta catalyst. The polymerizable compound having in its molecule a polymerizable double bond and an alicyclic structure can be generally polymerized into a polymer of high molecular weight if a Ziegler-Natta catalyst is employed. However, since a polymer of low molecular weight can be satisfactorily utilized in this invention as long as it is capable of being formed into a film, the polymerizable compound may be polymerized by any convenient method such as radical polymerization, and the resultant mixture comprising compounds of low molecular weight and high molecular weight can be used as it is.

It is preferable in the polymerization of this polymerizable compound to copolymerize it with acrylic acid, maleic anhydride, an ester of acrylic acid or maleic anhydride, vinylphenol, vinylnaphthol, hydroxyethylmethacrylate, $SO_2$, etc. in view of adjusting the alkali-solubility thereof or improving the adhesion thereof to a resist film or a substrate. With respect to the alkali-soluble group of these alkali-soluble compounds, it may be copolymerized with a compound protected by an acid-decomposable group exhibiting solubility inhibition to an alkaline solution. However, it is preferable in view of assuring the transparency of the resist to a light of short wavelength to copolymerize it with a compound which is free from a molecular skeleton exhibiting a large absorption at a short wavelength such as benzene nucleus. Specifically, it is preferable to select an alkali-soluble resin which exhibits a light absorbency of 4 or less, more preferably 2 or less per 1 µm to a light of 193 nm in wavelength. However, if the photosensitive material of this invention is to be employed as an upper resist in a substrate having an intermediate layer, the film thickness of the resist may be reduced, so that the aforementioned absorbency may be increased up to about 8 per 1 μm.

The copolymerization ratio of the alkali-soluble compound such as acrylic acid in this case should preferably be confined to 1 to 50%, more preferably 10 to 50% of the resultant copolymer. Because if the content of the alkali-soluble compound is less than 1%, it may be difficult to attain a sufficient alkali-solubility of the polymer. On the other hand, if the content of the alkali-soluble compound exceeds over 50%, it may give rise to a non-uniform dissolution of the alkali-soluble compound, thus making it difficult to form a resist pattern.

The average molecular weight of aforementioned alkali-soluble polymer according to this invention should preferably be in the range of 500 to 500,000, more preferably 5,000 to 15,000. Because, if the average molecular weight of the alkali-soluble resin is less than 500, it may be difficult to form a resist film having a sufficient mechanical strength. On the other hand, if the average molecular weight of the polymer compound exceeds over 500,000, it may be difficult to form a resist film having an excellent resolution. This alkali-soluble polymer is generally constituted by a mixture comprising various components each having a different molecular weight from others. However, this invention is effective even if the alkali-soluble polymer contains compounds of relatively low molecular weight. For example, even if the polymer is mainly constituted by compounds having a molecular weight of 500 to 1,000, it is possible to avoid non-uniform dissolution. Further, even if a large amount of monomer is left remained in the polymer in this case, it would not badly affect the solubility of the polymer in an alkaline developing solution or the dry etch resistance of the resist pattern to be obtained.

As for the diazo compound constituting the other component of the photosensitive material of this invention, it is possible to employ various kinds of diazo compound, such as a diazo compound represented by the following general formula (1); p-quinone diazide such as β-naphthylamide of p-benzoquinosulfonic acid; p-iminoquinone diazide as disclosed in British Patent No. 723382; organic solvent-soluble condensation products derived from diazonium salt and formaldehyde as disclosed in British Patent No. 1110017; aromatic diazoium salt such as p-diazodiphenyl amine salt and co-condensation products derived from 4,4-bismethoxymethyldiphenyl ether and formaldehyde; copolymer products derived from an aromatic product of other kinds and formaldehyde; and an aromatic azide such as azide compounds set forth in British Patent No. 745886.

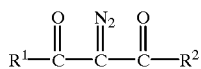
(1)

wherein $R^1$ and $R^2$ may be the same or different and are individually hydrogen atom, a substituted or unsubstituted alkyl group having 1 to 20 carbon atoms, a substituted or unsubstituted aryl group having 1 to 20 carbon atoms, or a Si-containing substituted or unsubstituted aryl group.

Among these diazo compounds, o-quinone diazides such as aromatic ester or aromatic amide of o-naphthoquinone diazide sulfonic acid or of o-naphthoquinone diazide carboxylic acid are more preferable in view of environment and heat resistance as a positive photosensitive agent. Among them, naphthoquinone diazidosulfonic acid esters of polyhydroxybenzophenone are more preferable. More specifically, 1,2-naphthoquinone diazidosulfonic acid ester of 2,3,4-trihydroxybenzophenone or 1,2-naphthoquinone diazidosulfonic acid ester of 2,3,4,4'-tetrahydroxybenzophenone are most preferable.

Among these two most preferable examples as a photosensitive agent, the latter (1,2-naphthoquinone diazidosulfonic acid ester of 2,3,4,4'-tetrahydroxybenzophenone) is particularly preferable in view of improving the heat resistance of resist. In this photosensitive agent, the esterification ratio of 2,3,4,4'-tetrahydroxybenzophenone by the 1,2-naphthoquinone diazidosulfonic acid should preferably be 40 to 100% based on the total number of hydroxyl group in this compound. Because, if the esterification ratio is less than 40%, the resolution of the resultant resist may be deteriorated.

For example, the number of naphthoquinone diazide to be introduced into 2,3,4,4'-tetrahydroxybenzophenone should be in the range of 1.6 to 4 in average per molecule of 2,3,4,4'-tetrahydroxybenzophenone, this range being controlled by a mixture of various tetrahydroxybenzophenones each having one two, three or four naphthoquinone diazide groups.

The mixing ratio of the aforementioned diazo compound in the photosensitive material of this invention should preferably be in the range of 20 to 60 wt %, more preferably 30 to 50 wt % based on the alkali-soluble resin. If the aforementioned mixing ratio of diazo compound is less than 20 wt %, the effect to be attained by the addition of diazo compound would become insufficient. On the other hand, if the aforementioned mixing ratio of diazo compound exceeds over 60 wt %, the transparency of the alkali-soluble resin to ArF excimer laser beam, which is one of the features of the alkali-soluble resin, would be deteriorated.

This diazo compound may be introduced, if desired, to the side chain of the alkali-soluble resin. In this case, due to the aforementioned reason, the alkali-soluble resin should desirably be provided with an alicyclic skeleton. Even in this case where diazo compound is included in the alkali-soluble resin, the ratio of diazo compound should preferably be in the range of 20 to 60 wt %, more preferably 30 to 50 wt % based on the alkali-soluble resin.

The photosensitive material according to this invention can be prepared by dissolving the aforementioned alkali-soluble resin and diazo compound in a predetermined solvent, or by dissolving the aforementioned alkali-soluble resin having on its side chain the aforementioned diazo compound in a predetermined solvent.

The solvents useful in this case are a ketone type solvent such as cyclohexanone, acetone, methyl ethyl ketone and methylisobutyl ketone; a cellosolve type solvent such as methylcellosolve, methylcellosolve acetate, ethylcellosolve acetate and butylcellosolve acetate; an ester type solvent such as ethyl acetate, butyl acetate, isoamyl acetate and γ-butyrolactone; a glycol type solvent such as propyleneglycol monomethylether acetate; a nitrogen-containing solvent such as dimethylsulfoxide, hexamethylphosphoric triamide, dimethylformamide and nmethylpyrrolidone; and a mixed solvent containing dimethylsulfoxide, dimethylformaldehyde or nmethylpyrrolidone in addition to any of the aforementioned solvents for the purpose of improving the solubility thereof. It is also possible to employ, as a preferable example, propionic acid derivatives such as methyl methylpropionate; lactates such as ethyl lactate; and PGMEA (propyleneglycol monoethyl acetate), since these solvents are low in toxicity. These solvents may be employed singly or in combination. These solvents may contain a suitable amount of aliphatic alcohol such as isopropyl alcohol, ethyl alcohol, methyl alcohol, butyl alcohol, n-butyl alcohol, s-butyl alcohol, t-butyl alcohol and isobutyl alcohol; or aromatic solvent such as xylene and toluene.

Followings are a detailed explanation on the process of forming a pattern by making use of a photosensitive material of this invention prepared as mentioned above.

A solution of photosensitive material, which is prepared by dissolving a photosensitive material in an organic solvent as exemplified above is coated on the surface of a substrate by means of a spin-coating method or a dipping method. Then, the coated layer is dried at a temperature of 150° C. or less, or preferably at a temperature of 70 to 120° C. thereby forming a resist film.

The substrate to be employed in this case may be for example a silicon wafer; a silicon wafer having an insulating film, electrodes or interconnecting wirings formed on the surface thereof; a blank mask; a Group III–V compounds (such as GaAs, AlGaAs) semiconductor wafer; a chrome- or chrome oxide-deposited mask; an aluminum-deposited substrate; an BPSG (Boro Phospho Silicate Glass)-coated substrate; a PSG (Phospho Silicate Glass)-coated substrate; an SOG (Spin On Glass)-coated substrate; or a carbon film-sputtered substrate.

An intermediate layer consisting of polysilane or polysilicon may be formed on these substrate to a thickness of 0.5 to 5 μm in prior to coating the photosensitive material of this invention as an upper resist film.

The final film thickness (after the evaporation of solvent) of the resist film to be formed on a substrate may differ depending on the end-use, but is preferably in the range of 0.05 to 15 μm in general. Because if this final film thickness falls outside this range, the sensitivity or resolution of the resist would be deteriorated.

Then, the resist film is irradiated through a predetermined pattern or through a predetermined mask with actinic radiation, or the actinic radiation may be directly scanned over the surface of the resist film. Since the photosensitive material according to this invention is excellent in transparency not only to the light of short wavelength but also to the light of wide wavelength range, the actinic radiation to be employed in this exposure may be ultraviolet rays; X-rays; the i-line, h-line or g-line of low pressure mercury lamp light beam; a xenon lamp beam; a deep UV beam such as KrF, ArF or $F_2$ excimer laser beam; a synchrotron orbital radiation beam (SOR); an electron beam (EB); γ-rays; and an ion beam. In particular, when a short wavelength beam such as ArF excimer laser beam is employed as a light source, the effect of the photosensitive material of this invention may become most prominent.

The resist film may be baked if desired after a light exposure at a temperature of about 100° C.

Subsequently, the resist film thus exposed is subjected to a developing treatment by way of a dipping method or spraying method using an alkaline solution, thereby selectively dissolving and removing the exposed portion or unexposed portion of the resist film to obtain a desired pattern. The alkaline solution useful as a developing solution in this case may be an organic alkali aqueous solution such as an aqueous solution of tetramethylammonium hydroxide and an aqueous solution of choline; an inorganic alkali solution such as an aqueous solution of potassium hydroxide and sodium hydroxide. These alkaline solutions may additionally contain alcohol or a surfactant. The concentration of these alkaline solutions should preferably be 15% by weight or less in view of obtaining a sufficient difference in dissolution rate between the exposed portion and the unexposed portion.

The substrate and resist pattern obtained after the development thereof may be subsequently subjected to a rinsing treatment by making use of water for instance.

Since the photosensitive material of this invention contains both alkali-soluble resin and diazo compound, the transparency thereof to ArF excimer laser beam is excellent, thus making it possible to form a resist pattern while assuring high sensitivity and high resolution.

Therefore, the resist pattern to be formed by making use of the photosensitive material exhibiting such an excellent transparency as mentioned above that can be obtained by this invention is very excellent in resolution. Moreover, the resist pattern to be formed in this manner is excellent in adhesion with a substrate and hence is free from the peeling thereof from the substrate. Accordingly, when a dry etching is performed with this resist pattern employed as an etching mask for instance, an ultra-fine pattern having line width of the order of quarter micron or less can be accurately transcribed onto an exposed surface of a substrate.

When an alkali-soluble resin having an alicyclic skeleton or a polycyclic condensation skeleton is compounded as a component into the photosensitive material of this invention, it is possible to obtain a resist pattern exhibiting an excellent dry etch resistance, since this resist pattern is capable of retaining any of carbon-carbon bonds even if one of carbon-carbon bonds is caused to cut to open.

Any additional steps may be included in the aforementioned process of forming a resist pattern. For example, a surface-flattening step for flattening the underlying layer of the resist film; a pretreatment step for improving the adhesion between the resist film and an underlying layer; a rinsing step for removing a developing solution with water for example after the development of the resist film; and a step of re-irradiating ultraviolet rays prior to dry etching may be included.

The method of forming a pattern according to this invention can be preferably applied to a multi-layer resist-forming process as explained below.

In this application of the method to a multi-layer resist-forming process, an upper layer to be subjected to an exposure by means of ArF excimer laser as a first actinic radiation and a lower layer to be subjected toan exposure by means of a light of 200 to 260 nm wavelength range as a second actinic radiation can be formed. Alternatively, an upper layer to be subjected to an exposure by means of a low accelerating electron beam and a lower layer to be subjected to an exposure by means of a light of 190 to 260 nm wavelength range may be formed.

In the former case, a photosensitive material including a polycyclic condensation skeleton containing such as naphthyl such as group, thus exhibiting a high transparency at a wavelength of 193 nm and a high absorption at a wavelength of approximately 220 nm may be preferably employed as the upper layer, while a resist, such as a phenol resin represented by any of following chemical formulas (P-1) to (P-4), exhibiting a high transparency at a wavelength of 200 to 260 nm and a high dry etch resistance may be preferably employed as the lower layer.

On the other hand, in the latter case, a photosensitive material containing a substituted or unsubstituted aromatic polycyclic condensation or benzene ring, thus exhibiting a high absorption at a wavelength of approximately 190 to 260 nm and hence being capable of being exposed and developed with high sensitivity to a low accelerating electron beam may be preferably employed as the upper layer, while a photosensitive material which is suited for an exposure with a light having a wavelength of 200 to 260 nm and exhibits a high dry etch resistance may be preferably employed as the lower layer. If a photosensitive material containing an aromatic polycyclic condensation ring exhibiting a high absorption at a wavelength of approximately 220 nm is to be employed as the upper layer, a phenol resin represented by any of the following chemical formulas may be preferably employed as the lower layer. On the other hand, if a photosensitive material containing a benzene ring exhibiting a high absorption at a wave-length of approximately 193 nm is to be employed as the upper layer, an acrylic resin having an alicyclic skeleton may be preferably employed as. the lower layer.

Examples of the aforementioned aromatic polycyclic condensation ring are substituted or unsubstituted naphthalene and anthracene which are attached to the polycyclic condensation skeleton. Examples of a photosensitive material having the aforementioned benzene ring are phenol resin and novolak resin.

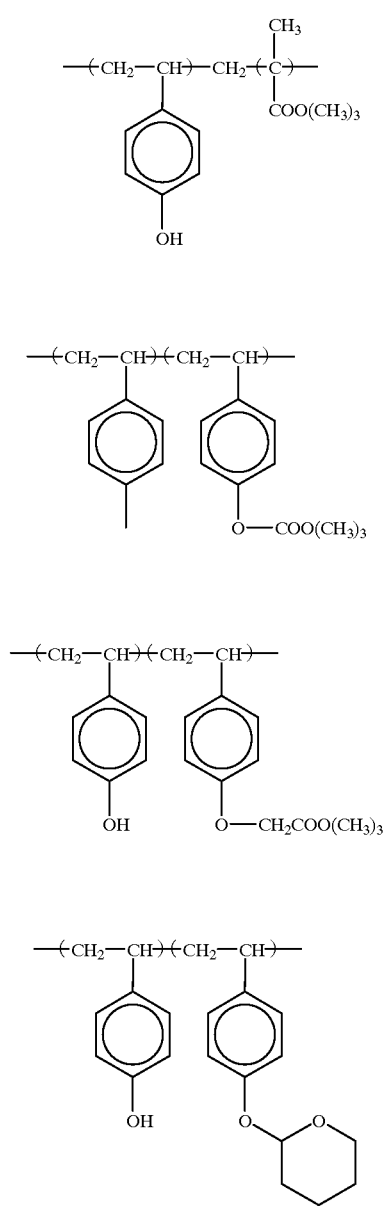

The upper layer is not required to be high in dry etching resistance as long as the lower layer is provided with a high dry etch resistance, i.e. the upper layer is only required to have a sufficient absorbency to enable it useful as a mask at the occasion of performing the exposure of the lower layer. The film thickness of the upper layer may be also optionally selected as long as it meets the aforementioned conditions. Therefore, the upper layer may be made thinner in film thickness and may not necessarily be required to have a high sensitivity, so that this invention can be preferably applied not only to a chemical amplification type resist but also to various types of resist other than the chemical amplification type resist.

By the way, there is known a problem called "mixing" when both upper and lower layers are constituted by a photosensitive material layer wherein the solvents contained in the upper and lower layers are mixed together at the interface between the upper and lower layers. One of the solution for solving this problem is to form a layer called "a barrier coat" at the interface between the upper and lower layers at the occasion of forming the upper and lower layers, this barrier coat being designed not to cause the mixing between it and either one of the upper and lower layers. However, the presence of this barrier coat layer is not preferable in view of shortening the entire process or saving the cost for raw materials.

In the method of forming a pattern according to this invention however, the influence by the mixing is negligible, since the materials employed therein are of the kinds which hardly give rise to the problem of mixing. Furthermore, for the purpose of preventing the mixing, a material which is hardly soluble is employed as the lower layer. For instance, if the upper layer is to be exposed with ArF excimer laser, polyhydroxysyrene-based resist is employed as a lower resist layer for KrF excimer laser, while a xylene solvent type resist for ArF excimer laser is employed as an upper resist layer. By the way, if a xylene solvent type resist for a chemical amplification type ArF excimer laser is to be employed, a nonionic photo-acid-generating agent such as naphthalidyl triflate can be preferably employed as an acid-generating agent. A quinonediazide compound containing quinonediazide group at a high ratio can be preferably employed not only as a photosensitive agent but also as a photo-acid-generating agent.

Furthermore, it is also possible to incorporate a photoabsorptive compound such as novolak or naphthol novolak as set forth in Japanese Patent Unexamined Publication H/8-221230 into the upper resist layer for ArF excimer laser in such an amount that would not cause a deterioration of transparency of the resist to a light of 193 nm in wavelength. The inclusion of this photoabsorptive compound in the resist is effective in enhancing the light absorbency of the resist in a wavelength region of 210 to 260 nm. By the way, the aforementioned novolak and naphthol novolak are effective also as a solubility-inhibiting agent.

On the other hand, if the exposure of the upper layer is to be performed by means of electron beam, a low accelerating electron beam of 10 keV or less is preferable in view of assuring a resist sensitivity in the formation of patterns. As for the resist material for electron beam that is useful in this invention, those comprising novolak or polystyrene resin and exhibiting a high absorbency at a wavelength of 193 nm can be preferably employed.

This invention will be further explained with reference to the following specific examples including synthesis examples.

SYNTHESIS No. 1

<Synthesis of an alkali-soluble acrylic resin having on its side chain an alicyclic structure>

6.0 g of a mixture consisting of 33 mole % of menthyl methacrylate, 29 mole % of methyl methacrylate and 38 mole % of methacrylic acid was mixed with 20 g of tetrahydrofuran (THF) thereby to obtain a mixed solution, to which 0.73 g of azoisobutyronitrile (AIBN) was added. Then, the resultant mixture was allowed to undergo a reaction with stirring at a temperature of 60° C. for 35 hours. The reaction mixture was then dripped into n-hexane to obtain a precipitate, which was then filtered and dried to obtain a copolymer having a weight average molecular weight of about 10,000 (converted as styrene).

SYNTHESIS No. 2

<Synthesis of an alkali-soluble acrylic resin having on its side chain an alicyclic structure and a diazo compound>

Equimolars of hydroxyethyl methacrylate and 1,2-naphthoquinonediazido-4-sulfonic acid chloride were dissolved in dioxane to obtain a 10 wt % solution of dioxane. Then, this solution was maintained at a temperature of 20° C. during which a predetermined amount of triethylamine which was correspondent to 1.2 equivalents of 1,2-naphthoquinonediazido-4-sulfonic acid chloride was slowly dripped into the dioxane solution to precipitate a salt, which was then separated through filtration. The salt thus obtained was put in a large amount of 0.2% solution of oxalic acid to obtain a precipitate. The precipitate was then separated from the oxalic acid solution through filtration, and, after being washed with a deionized water, vacuum-dried to obtain hydroxyethylmethacrylate naphthoquinonediazidosulfonate.

Then, 6.0 g of a mixture consisting of 33 mole % of menthyl methacrylate, 29 mole % of hydroxyethylmethacrylate naphthoquinonediazidosulfonate and 38 mole % of methacrylic acid was mixed with 20 g of tetrahydrofuran (THF) thereby to obtain a mixed solution, to which 0.73 g of azoisobutyronitrile (AIBN) was added. Then, the resultant mixture was allowed to undergo a reaction with stirring at a temperature of 60° C. for 35 hours. The reaction mixture was then dripped into n-hexane to obtain a precipitate, which was then filtered and dried to obtain a copolymer having a weight average molecular weight of about 10,000 (converted as styrene).

SYNTHESIS No. 3

<Synthesis of an alkali-soluble acrylic resin having on its side chain a polycyclic condensation structure>

6.0 g of a mixture consisting of 30 mole % of vinylnaphthalene, 30 mole % of methyl methacrylate and 40 mole % of methacrylic acid was mixed with 20 g of tetrahydrofuran (THF) thereby to obtain a mixed solution, to which 0.60 g of azoisobutyronitrile (AIBN) was added. Then, the resultant mixture was allowed to undergo a reaction with stirring at a temperature of 60° C. for 35 hours. The reaction mixture was then dripped into n-hexane to obtain a precipitate, which was then filtered and dried to obtain a copolymer having a weight average molecular weight of about 7,000 (converted as styrene).

SYNTHESIS No. 4

<Synthesis of an alkali-soluble acrylic resin having on its side chain an alicyclic structure and a polycyclic condensation structure>6.0 g of a mixture consisting of 15 mole % of vinylnaphthalene, 20 mole % of menthyl methacrylate, 30 mole % of methyl methacrylate and 35 mole % of methacrylic acid was mixed with 20 g of tetrahydrofuran (THF) thereby to obtain a mixed solution, to which 0.60 g of azoisobutyronitrile (AIBN) was added. The, the resultant mixture was allowed to undergo a reaction with stirring at a temperature of 60° C. for 35 hours. The reaction mixture was then dripped into n-hexane to obtain a precipitate, which was then filtered and dried to obtain a copolymer having a weight average molecular weight of about 7,000 (converted as styrene).

SYNTHESIS No. 5

<Synthesis of a chemical amplification type acrylic resin having on its side chain an alicyclic structure and a polycyclic condensation structure>

9.43 g of a mixture consisting of 26.2 mole % of vinylnaphthalene, 19.4 mole % of menthyl acrylate, 21.6 mole % of tetrahydropyranyl methacrylate and 32.7 mole % of methacrylic acid was mixed with 20 g of tetrahydrofuran (THF) thereby to obtain a mixed solution, to which 1.6 g of azoisobutyronitrile (AIBN) was added. Then, the resultant mixture was allowed to undergo a reaction with stirring at a temperature of 60° C. for 40 hours. The reaction mixture was then dripped into n-hexane to obtain a precipitate, which was then filtered and dried to obtain a copolymer having a weight average molecular weight of about 6,000 (converted as styrene).

SYNTHESIS No. 6

<Synthesis of a solubility-inhibiting agent: 1-adamanthylcarbonyl-2,2'-ditert-buthoxycarbonyl ethane>

0.02 mole of ditert-butyl malonate was dissolved in THF to obtain a THF solution which was then gradually added to a solution dispersing therein 0.02 mole of sodium hydride at a temperature of 0° C. After the generation of hydrogen gas was finished, the reaction mixture was kept at room temperature and then a THF solution containing 0.02 mole of adamanthyl (bromomethyl) ketone was added to the reaction mixture thereby to allow the reaction to take place for five hours at room temperature. Then, the reaction solution was poured into a large volume of ice water and the reaction solution was ether-extracted to obtain an oily layer, which was then washed once with an aqueous solution of oxalic acid and then washed twice with water. Finally, the product was concentrated and dried to obtain 1-adamanthylcarbonyl-2, 2'-ditert-buthoxycarbonyl ethane (AdTB).

SYNTHESIS No. 7

<Synthesis of a solubility-inhibiting agent>

Naphthol was condensed with glyoxylic acid to obtain a novolak oligomer. Then, 10 g of this novolak oligomer was dissolved in 50 mL (milliliter) of 3,4-dihydropyrane to obtain a solution, which was then stirred in the presence of a catalytic amount of hydrochloric acid for 48 hours. Subsequently, solid sodium hydroxide was added to the solution, and, after being stirred for a while, residues were separated through filtration, thus leaving an oily layer. This oily layer was concentrated under a reduced pressure and dried. The product thus obtained was then dissolved in ethyl acetate and washed twice with a 5% aqueous solution of oxalic acid. The product liquid was separated and then dried by making use of sodium sulfate anhydride. Finally, the product liquid was concentrated and dried to obtain pyranylated naphthol novolak (NV4THP).

SYNTHESIS No. 8

<Synthesis of a photosensitive agent>

0.1 g of α-naphthol was dissolved in THF to obtain a THF solution, to which 0.1 mole of 1,2-naphthoquinonediazide-4-sulfonyl chloride was added to obtain a mixed solution. Then, 0.1 mole of triethyl amine was gradually dripped to this mixed solution with stirring at a temperature of 0° C. After precipitated salts were removed through filtration, the reaction liquid was concentrated and dried, and then recrystallized to obtain a naphthoquinonediazide compound of naphthol (NPNQ).

EXAMPLE 1

To the polymer obtained in the Synthesis No. 1 was added naphthoquinonediazide as a diazo compound at a ratio of 40 wt % to obtain a mixture, which was then dissolved in cyclohexanone to obtain a 8 wt % cyclohexanone solution thereof. Thereafter, this solution was filtered through a 0.2 μm membrane filter, and then spin-coated on the surface of an Si wafer. The coated layer was then prebaked at a temperature of 100° C. for 90 seconds to obtain a resist film having a film thickness of 0.2 μm.

This resist film was then exposed to an irradiation of ArF excimer laser beam (NA=0.55) having a wavelength of 193 nm. Then, the resultant resist film was developed with an alkaline developing solution consisting of a 2.38% aqueous alkaline solution of tetramethylammonium hydroxide (TMAH). As a result, it was possible with an exposure dosage of 130 mJ/cm$^2$ to form a line-and-space pattern having a line width of 0.15 μm. Furthermore, the pattern thus formed was found excellent in adhesion with the substrate, i.e. a peeling of pattern was not observed at all.

EXAMPLE 2

To the polymer obtained in the Synthesis No. 1 was added a diazo compound of Meldrum's acid at a ratio of 45 wt % to obtain a mixture, which was then dissolved in ethyl lactate to obtain a 8 wt % ethyl lactate solution thereof. Thereafter, this solution was filtered through a 0.2 μm membrane filter, and then spin-coated on the surface of an Si wafer. The coated layer was then prebaked at a temperature of 120° C. for 90 seconds to obtain a resist film having a film thickness of 0.2 μm.

This resist film was then exposed to an irradiation of ArF excimer laser beam (NA=0.55) having a wavelength of 193 nm. Then, the resultant resist film was developed with an alkaline developing solution consisting of a 2.38% aqueous alkaline solution of tetramethylammonium hydroxide (TMAH). As a result, it was possible with an exposure dosage of 120 mJ/cm$^2$ to form a line-and-space pattern having a line width of 0.15 μm. Furthermore, the pattern thus formed was found excellent in adhesion with the substrate, i.e. a peeling of pattern was not observed at all.

EXAMPLE 3

To the polymer obtained in the Synthesis No. 1 was added naphthoquinonediazide as a diazo compound at a ratio of 40 wt % to obtain a mixture, which was then dissolved in cyclohexanone to obtain a 8 wt % cyclohexanone solution thereof. Thereafter, this solution was filtered through a 0.2 μm membrane filter, and then spin-coated on the surface of an Si wafer. The coated layer was then prebaked at a temperature of 100° C. for 90 seconds to obtain a resist film having a film thickness of 0.5 μm.

This resist film was then exposed to an irradiation of electron beam and the resultant resist film was developed with an alkaline developing solution consisting of a 2.38% aqueous alkaline solution of TMAH. As a result, it was possible with an accelerating voltage of 50 keV and an exposure dosage of 30 μC/cm$^2$ to form a line-and-space pattern having a line width of 0.15 μm. Furthermore, the pattern thus formed was found excellent in adhesion with the substrate, i.e. a peeling of pattern was not observed at all.

EXAMPLE 4

This example will be explained with reference to FIGS. 1A to 1F.

First of all, to the polymer obtained in the Synthesis No. 1 was added naphthoquinonediazide as a diazo compound at a ratio of 40 wt % to obtain a mixture, which was then dissolved in cyclohexanone to obtain a 8 wt % cyclohexanone solution thereof, or a resist solution of this invention.

On the other hand, as shown in FIG. 1A, a novolak type photoresist was coated on a Si wafer 11 and hard-baked at a temperature of 190° C. to form an under-lying layer 12 having a film thickness of 0.8 μm. Then, SOG (spin-on glass) was coated on this underlying layer 12 and baked at a temperature of 200° C. to form an intermediate layer 13 having a film thickness of 0.1 μm.

Figure 1B:
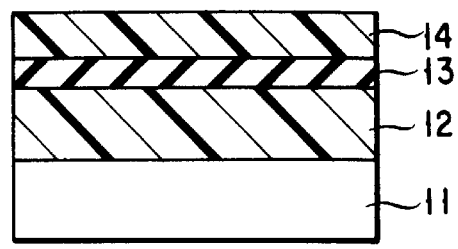
Figure 1C:
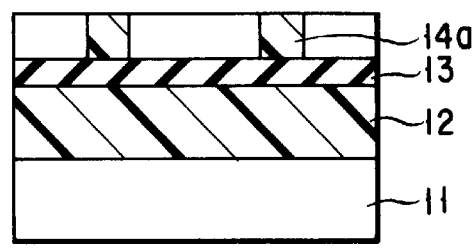

Then, the aforementioned cyclohexanone solution was filtered through a 0.2 μm membrane filter, and then spin-coated on the surface of an Si wafer which was provided in advance with the underlying layer 12 and intermediate layer 13 as mentioned above. The coated layer was then prebaked at a temperature of 100° C. for 90 seconds to obtain as shown in FIG. 1B an upper resist film 14 having a film thickness of 0.2 μm.

Figure 1D:
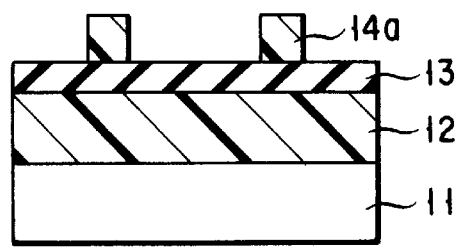

This resist film 14 was then exposed to an irradiation of ArF excimer laser beam (NA=0.55) having a wavelength of 193 nm. Then, the resultant resist film was developed with an alkaline developing solution consisting of a 2.38% aqueous alkaline solution of TMAH. As a result, it was possible with an exposure dosage of 130 mJ/cm$^2$ to form a line-and-space pattern 14a having a line width of 0.15 μm as shown in FIG. 1D. Furthermore, the pattern thus formed was found excellent in adhesion with the substrate, i.e. a peeling of pattern was not observed at all.

Figure 1E:
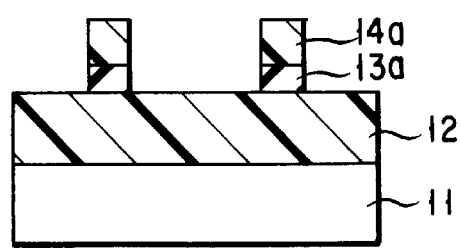
Figure 1F:
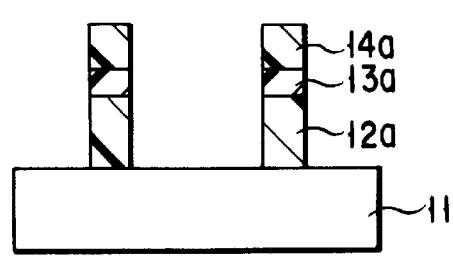

Then, by making use of the aforementioned resist pattern 14a as an etching mask, the SOG film 13 constituting an intermediate layer was subjected to an etching by means of the RIE method using $CF_4$ to form a patterned SOG film 13a as shown in FIG. 1E. Furthermore, by making use of the aforementioned patterns 14a and 13a as an etching mask, the novolak type photoresist film 12 constituting an underlying layer was subjected to an etching by means of the RIE method using $O_2$ to form a patterned novolak type photoresist film 12a as shown in FIG. 1F. The photoresist film 12a thus obtained was found as being an accurate transcription of the resist pattern.

EXAMPLE 5

The polymer obtained in the Synthesis No. 2 was disolved in cyclohexanone to obtain a 8 wt % cyclohexanone solution thereof. Thereafter, this solution was filtered through a 0.2 μm membrane filter, and then spin-coated on the surface of an Si wafer. The coated layer was then prebaked at a temperature of 100° C. for 90 seconds to obtain a resist film having a film thickness of 0.3 μm.

This resist film was then exposed to an irradiation of ArF excimer laser beam (NA=0.55) having a wavelength of 193 nm. Then, the resultant resist film was developed with an alkaline developing solution consisting of a 2.38% aqueous alkaline solution of TMAH. As a result, it was possible with an exposure dosage of 100 mJ/cm$^2$ to form a line-and-space pattern having a line width of 0.15 μm. Furthermore, the pattern thus formed was found excellent in adhesion with the substrate, i.e. a peeling of pattern was not observed at all.

EXAMPLE 6

To the polymer obtained in the Synthesis No. 3 was added naphthoquinonediazide as a diazo compound at a ratio of 20 wt % to obtain a mixture, which was then dissolved in cyclohexanone to obtain a 8 wt % cyclohexanone solution thereof. Thereafter, this solution was filtered through a 0.2 μm membrane filter, and then spin-coated on the surface of an Si wafer. The coated layer was then prebaked at a temperature of 100° C. for 90 seconds to obtain a resist film having a film thickness of 0.17 μm.

This resist film was then exposed to an irradiation of ArF excimer laser beam (NA=0.55) having a wavelength of 193 nm. Then, the resultant resist film was developed with an alkaline developing solution. As a result, it was possible with an exposure dosage of 140 mJ/cm$^2$ to form a line-and-space pattern having a line width of 0.17 μm. Furthermore, the pattern thus formed was found excellent in adhesion with the substrate, i.e. a peeling of pattern was not observed at all.

EXAMPLE 7

To the polymer obtained in the Synthesis No. 4 was added naphthoquinonediazide as a diazo compound at a ratio of 30 wt % to obtain a mixture, which was then dissolved in a mixed solution comprising cyclohexanone/PGMEA (mixing ratio: 3:1) to obtain a 8 wt % solution thereof. Thereafter, this solution was filtered through a 0.2 μm membrane filter, and then spin-coated on the surface of an Si wafer which was surface-treated in advance with HMDS (hexamethyl disilazane). The coated layer was then prebaked at a temperature of 120° C. for 90 seconds to obtain a resist film having a film thickness of 0.2 μm.

This resist film was then exposed to an irradiation of ArF excimer laser beam (NA=0.55) having a wavelength of 193 nm. Then, the resultant resist film was developed with an alkaline developing solution. As a result, it was possible with an exposure dosage of 135 mJ/cm$^2$ to form a line-and-space pattern having a line width of 0.15 μm. Furthermore, the pattern thus formed was found excellent in adhesion with the substrate, i.e. a peeling of pattern was not observed at all.

EXAMPLE 8

This example will be explained with reference to FIGS. 2A to 2C.

Figure 2A:
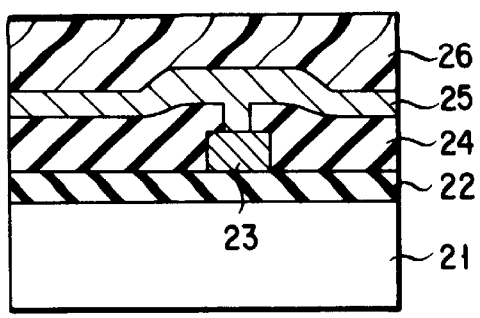
FIGS. 2A to 2C illustrate sectional views schematically showing the process of forming a resist pattern according to another example of this invention.
Figure 2B:
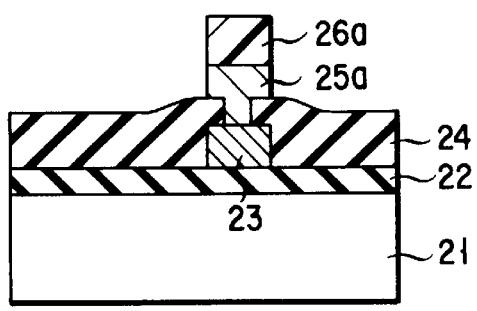
Figure 2C:
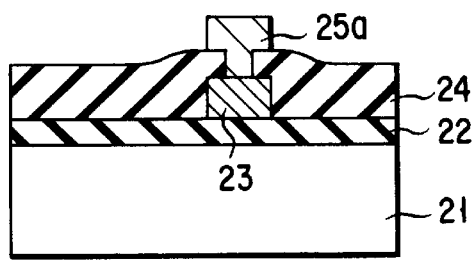

First of all, as shown in FIG. 2A, a silicon oxide film 22 having a thickness of 0.8 μm was deposited on a Si wafer 21 by means of a CVD (Chemical Vapor Deposition) method. Thereafter, an underlying wiring layer 23 consisting of Al—Si—Cu and having a thickness of about 0.7 μm, an interlayer insulating film 24 consisting of an SiO$_2$ film formed by means of CVD method, and an upper wiring film 25 consisting of Al—Si—Cu and having a thickness of about 0.7 μm were successively deposited on the silicon oxide film 22.

On the other hand, to the polymer obtained in the Synthesis No. 4 was added naphthoquinonediazide as a diazo compound at a ratio of 30 wt % to obtain a mixture, which was then dissolved in a mixed solution comprising cyclohexanone/PGMEA (mixing ratio: 3:1) to obtain a 8 wt % solution thereof. Thereafter, this solution was filtered through a 0.2 μm membrane filter, and then spin-coated on the surface of the upper wiring film 25 formed on the Si wafer. The coated layer was then prebaked at a temperature of 120° C. for 90 seconds to form a resist film 26 having a film thickness of 0.3 μm on the surface of the upper wiring film 25.

This resist film 26 was then exposed to an irradiation of ArF excimer laser beam (NA=0.55) with an exposure dosage of 135 mJ/cm$^2$. Then, the resultant resist film was developed with an alkaline developing solution to obtain a resist pattern 26a as shown in FIG. 2B. Furthermore, by making use of this resist pattern 26a as an etching mask, the upper wiring film was subjected to an etching by means of the RIE method employing CCl$_4$ gas to form a patterned upper wiring 25a and then the resist pattern 26a was removed by ashing it in an O$_2$ plasma, thereby forming a 2-ply wiring as shown in FIG. 2C.

It was found as a result that the upper wiring 25a was not substantially influenced by the step height that was developed by the presence of the underlying layer, etc., thus exhibiting a design error of only ±0.05 μm to the predetermined design dimension of 0.35 μm. Moreover, when an upper wiring of 0.35 μm in line interval and 0.35 μm in line width was formed, any defect such as breaking of wire or short circuit was not recognized.

EXAMPLE 9

This example will be explained with reference to FIGS. 3A to 3E.

First of all, to the polymer represented by the aforementioned chemical formula (P-1) was added onium salt (triphenylsulfonium triflate) as an acid-generating agent, thereby forming a PGMEA solution. Then, this PGMEA solution was filtered through a 0.2 μm membrane filter to obtain a solution for forming an underlying resist. On the other hand, the NPNQ was added as a photosensitive agent to the polymer obtained in the Synthesis No. 4 at a ratio of 40 wt %, which was then dissolved in xylene thereby form a xylene solution. This xylene solution was filtered through a 0.2 μm membrane filter to obtain a solution for forming an upper resist.

Figure 3A:
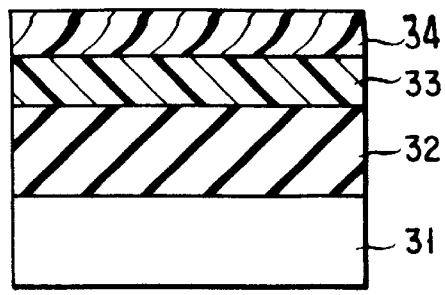
FIGS. 3A to 3E illustrate sectional views schematically showing the process of forming a resist pattern according to a further example of this invention.

On the other hand, as shown in FIG. 3A, a silicon oxide film 32 having a thickness of 0.8 μm was deposited on a Si wafer 31 by means of a CVD method. Then, the resist solution prepared for the underlying resist as mentioned above was spin-coated on the silicon oxide film 32 and prebaked at a temperature of 120° C. for 90 seconds to form an underlying resist film 33 having a film thickness of 0.4 μm.

Then, the resist solution prepared for the upper resist as mentioned above was spin-coated on the under-lying resist film 33 and prebaked at a temperature of 120° C. for 90 seconds to form an upper resist film 34 having a film thickness of 0.2 μm.

Figure 3B:
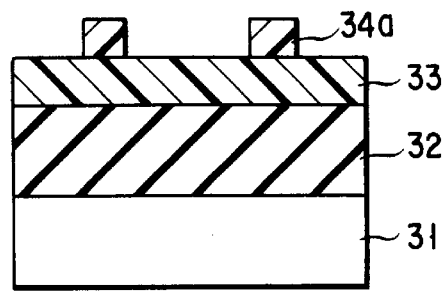
Figure 3C:
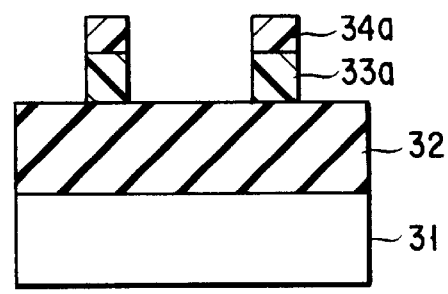
Figure 3D:
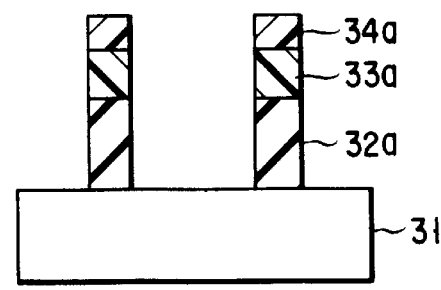
Figure 3E:
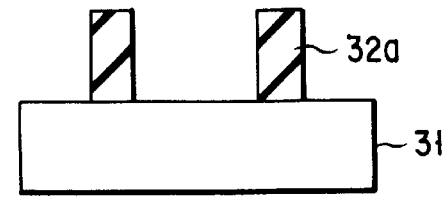

This upper resist film 34 was then exposed to an irradiation of ArF excimer laser beam and developed with an alkaline developing solution. As a result, a resist pattern 34a having a line width of 0.15 μm was obtained as shown in FIG. 3B. Furthermore, by making use of the aforementioned resist pattern 34a as an etching mask, the underlying resist film 33 was exposed to a light through an interference filter which was designed to permit a light about 220 nm in wavelength to pass therethrough, and then developed to obtain an underlying resist pattern 33a as shown in FIG. 3C. Furthermore, by making use of the aforementioned resist patterns 34a and 33a as an etching mask, the silicon oxide film 32 was subjected to an etching by means of the RIE method using CCl$_4$ to form a silicon oxide pattern 32a as shown in FIG. 3D, and then the resist pattern was removed by ashing it in an O$_2$ plasma, thereby forming a structure as shown in FIG. 3E.

It was found possible according to this example to form a pattern having a line width of 0.15 μm in a silicon oxide film.

EXAMPLE 10

First of all, to the polymer obtained in the Synthesis No. 1 was added, as a photosensitive agent, naphthoquinonediazide (naphthoquinonediazide-4-sulfonate of 2,3,4,4'-tetrahydroxybenzophenone). Then, the resultant mixture was dissolved in a mixed solution consisting of PGMEA and cyclohexanone to obtain a solution, which was then filtered through a 0.2 µm membrane filter to obtain a solution for forming an underlying resist. On the other hand, 3 wt % of naphthalidyl triflate and 20 wt % of NV4THP were added to the polymer obtained in the Synthesis No. 5 and then dissolved in ethyl lactate thereby forming a ethyl lactate solution. This ethyl lactate solution was filtered through a 0.2 µm membrane filter to obtain a solution for forming an upper resist.

On the other hand, as shown in FIG. 3A, a silicon oxide film 32 having a thickness of 0.8 µm was deposited on a Si wafer 31 by means of a CVD method. Then, the resist solution prepared for the underlying resist as mentioned above was spin-coated on the silicon oxide film 32 and prebaked at a temperature of 120° C. for 90 seconds to form an underlying resist film 33 having a film thickness of 0.4 µm.

Then, the resist solution prepared for the upper resist as mentioned above was spin-coated on the under-lying resist film 33 and prebaked at a temperature of 120° C. for 90 seconds to form an upper resist film 34 having a film thickness of 0.2 µm.

This upper resist film 34 was then exposed to an irradiation of electron beam of 5 keV and developed with an alkaline developing solution. As a result, a resist pattern 34a having a line width of 0.13 µm was obtained as shown in FIG. 3B. Furthermore, by making use of the aforementioned resist pattern 34a as an etching mask, the underlying resist film 33 was irradiated with ArF excimer laser, and then developed to obtain an underlying resist pattern 33a as shown in FIG. 3C. Furthermore, by making use of the aforementioned resist patterns 34a and 33a as an etching mask, the silicon oxide film 32 was subjected to an etching by means of the RIE method using $CCl_4$ to form a silicon oxide pattern 32a as shown in FIG. 3D, and then the resist pattern was removed by ashing it in an $O_2$ plasma, thereby forming a structure as shown in FIG. 3E.

It was found possible according to this example to form a pattern having a line width of 0.13 µm in a silicon oxide film.

EXAMPLE 11

First of all, to the polymer represented by the aforementioned chemical formula (P-1) was added onium salt (triphenylsulfonium triflate) as an acid-generating agent, thereby forming a PGMEA solution. Then, this PGMEA solution was filtered through a 0.2 µm membrane filter to obtain a solution for forming an underlying resist. On the other hand, the AdTB obtained in the Synthesis No. 6 was added as a solubility-inhibiting agent to the polymer obtained in the Synthesis No. 5 together with 3% of naphthalidyl triflate to obtain a mixture, which was then dissolved in xylene thereby form a xylene solution. This xylene solution was filtered through a 0.2 µm membrane filter to obtain a solution for forming an upper resist.

Then, the resist solution prepared for the under-lying resist as mentioned above was coated on a Si wafer to form an underlying film having a thickness of 0.4 µm. Thereafter, the resist solution prepared for the upper resist as mentioned above was spin-coated on the underlying resist film and then prebaked at a temperature of 120° C. for 90 seconds to form an upper resist film having a film thickness of 0.3 µm.

This upper resist film was then exposed to an irradiation of ArF excimer laser beam with an exposure dosage of 30 mJ/cm² and prebaked at a temperature of 110° C. for one minute. The resultant resist film was then developed with a 0.238% aqueous alkaline solution of TMAH. As a result, the upper resist pattern having a line width of 0.15 µm was obtained.

Furthermore, by making use of this upper resist pattern as a mask, the underlying resist film was exposed to a light through an interference filter which was designed to permit a light about 250 nm in wavelength to pass therethrough, and then baked at a temperature of 140° C. for one minute. Finally, the underlying resist film was developed with a 2.38% aqueous alkaline solution of TMAH to form a pattern having a line width of 0.15 µm on the substrate.

EXAMPLE 12

First of all, to the polymer represented by the aforementioned chemical formula (P-1) was added onium salt (triphenylsulfonium triflate) as an acid-generating agent, thereby forming a PGMEA solution. Then, this PGMEA solution was filtered through a 0.2 µm membrane filter to obtain a solution for forming an underlying resist. On the other hand, 20 wt % of the NV4THP obtained in the Synthesis No. 7 was added as a solubility-inhibiting agent to the polymer obtained in the Synthesis No. 5 together with 3% of naphthalidyl triflate to obtain a mixture, which was then dissolved in xylene thereby form a xylene solution. This xylene solution was filtered through a 0.2 µm membrane filter to obtain a solution for forming an upper resist.

Then, the resist solution prepared for the under-lying resist as mentioned above was coated on a Si wafer to form an underlying film having a thickness of 0.4 µm. Thereafter, the resist solution prepared for the upper resist as mentioned above was spin-coated on the underlying resist film and then prebaked at a temperature of 120° C. for 90 seconds to form an upper resist film having a film thickness of 0.2 µm.

This upper resist film was then exposed to an irradiation of ArF excimer laser beam with an exposure dosage of 35 mJ/cm² and prebaked at a temperature of 110° C. for one minute. The resultant resist film was then developed with a 0.238% aqueous alkaline solution of TMAH. As a result, the upper resist pattern having a line width of 0.14 µm was obtained.

Furthermore, by making use of this upper resist pattern as a mask, the underlying resist film was exposed to a light (5 mJ/cm²) through an interference filter which was designed to permit a light about 230 nm in wavelength to pass therethrough, and then baked at a temperature of 140° C. for one minute. Finally, the underlying resist film was developed with a 2.38% aqueous alkaline solution of TMAH to transcribe a pattern having a line width of 0.14 µm on the substrate.

It will be clear from the above Examples 1 to 8 that the photosensitive material according to this invention (claims 1 to 13) where an alkali-soluble acrylic resin is employed as a base polymer is excellent in transparency to a light of short wavelength such as ArF excimer laser. By contrast, according to the conventional resists where poly(hydroxystyrene) or novolak resin is employed as a main component, the light absorbency thereof at a wavelength of 193 nm is 30 or more per 1 µm, so that these conventional resists have been confirmed as being almost incapable of allowing ArF excimer laser beam to pass therethrough.

Since the photosensitive material according to this invention is different from the chemical amplification type resist where a catalytic reaction by an acid is utilized, the problems accompanied with the use of the chemical amplification type resist can be avoided. Namely, in the case of the chemical amplification type resist, two stages of reaction, i.e. an acid-generating reaction at the occasion of exposure and a catalytic reaction at the occasion of PEB are taken place, so that the stability of catalytic acid in relative to time, temperature and atmosphere is required to be taken account of. In particular, the stability of catalytic acid is greatly influenced by the time period between the exposure and the PEB, so that if this time period is too long, the formation of pattern may become impossible (time delay effects) (H. Roscher et al; Proc.SPIC 1672, 22 (1992)).

Therefore, it is expected that the photosensitive material according to this invention would exhibit an excellent environmental stability irrespective of time and temperature.

Comparative Example

To the polymer obtained in the Synthesis No. 1 was added triphenylsulfonium triflate at a ratio of 1 wt % as an acid-generating agent and then dissolved in cyclohexanone to obtain a cyclohexanone solution. Thereafter, the same procedures as explained in Example 1 were repeated except that the aforementioned cyclohexanone solution was employed.

This resist film was then exposed to an irradiation of ArF excimer laser beam (NA=0.55) having a wavelength of 193 nm and immediately after this exposure, the resist film was heated at a temperature of 150° C. for 90 seconds. Then, the resultant resist film was developed with an alkaline developing solution consisting of a 2.38% aqueous alkaline solution of TMAH. As a result, it was possible with an exposure dosage of 30 mJ/cm$^2$ to partially form a line-and-space pattern having a line width of 0.25 µm. However, the pattern thus formed was found poor in adhesion with the substrate, i.e. a nonuniform peeling of the resist pattern was recognized through the observation using an optical microscope.

It will be clear from Examples 9 to 12 that the photosensitive material of this invention is useful for the formation and transcription of pattern by means of the PCM method.

As explained above, it is possible according to this invention to provide a photosensitive material which is excellent in environmental stability, excellent in transparency to the light of short wavelength such as ArF excimer laser, and capable of forming a fine resist pattern which is high in adhesivity to the substrate by making use of an alkaline development.

Furthermore, since the exposure of the upper layer is performed by ArF excimer laser or electron beam by making use of the PCM method, while the exposure of the underlying layer is performed by ArF excimer laser or KrF excimer laser, it is possible to suitably perform the formation and transcription of a pattern.

Furthermore, according to the method of manufacturing electronic devices as set forth by this invention where the resist pattern formed according to the method of this invention is utilized as an etching mask, it is possible to accurately transcribe a very fine pattern onto a substrate, etc.

Therefore, the photosensitive material of this invention is quite useful for the photolithography in the fine working of a high density electronic device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A photosensitive material, which comprises:
   an alkali-soluble resin moiety having an alicyclic skeleton formed of a compound having a substituted or unsubstituted menthyl group; and a diazo compound moiety.

2. A photosensitive material, which comprises:
   an alkali-soluble resin moiety having a polycyclic condensation skeleton, or both alicyclic and polycyclic condensation skeleton; and a diazo compound moiety,
   wherein said photosensitive material exhibits a light absorbency of not more than 8 per 1 µm when exposed to light having a wavelength of 193 nm;
   said diazo compound moiety is contained in a ratio of from 30 to 60 wt % based on said alkali-soluble resin; and
   said alkali-soluble resin moiety contains a polycyclic condensation skeleton formed of a compound having a substituted or unsubstituted naphthyl group.

3. A photosensitive material, which comprises:
   an alkali-soluble resin moiety having an alicyclic skeleton, or both alicyclic and polycyclic condensation skeleton; and a diazo compound moiety,
   wherein said photosensitive material exhibits a light absorbency of not more than 8 per 1 µm when exposed to light having a wavelength of 193 nm;
   said alkali-soluble resin moiety is a copolymer comprising a vinyl or acrylic compound having an alicyclic skeleton, or both alicyclic and polycyclic condensation skeleton, and a monomer formed of a compound other than said vinyl or acrylic compound;
   said diazo compound moiety is contained in the photosensitive material as a separate component from said alkali-soluble resin in a ratio of from 30 to 60 wt % based on said alkali-soluble resin; and
   said alicyclic skeleton is formed of a compound having a substituted or unsubstituted menthyl group.

4. A photosensitive material, which comprises:
   an alkali-soluble resin moiety having a polycyclic condensation skeleton, or both alicyclic and polycyclic condensation skeleton; and a diazo compound moiety,
   wherein said photosensitive material exhibits a light absorbency of not more than 8 per 1 µm when exposed to light having a wavelength of 193 nm;
   said alkali-soluble resin moiety is a copolymer comprising a vinyl or acrylic compound having a polycyclic condensation skeleton, or both alicyclic and condensation skeleton, and a monomer formed of a compound other than said vinyl or acrylic compound;
   said diazo compound moiety is contained in the photosensitive material as a separate component from said alkali-soluble resin in a ratio of from 30 to 60 wt % based on said alkali-soluble resin; and
   said polycyclic condensation skeleton is formed of a compound having a substituted or unsubstituted naphthyl group.

5. A photosensitive material, which comprises:
   an alkali-soluble resin moiety having an alicyclic skeleton, or both alicyclic and polycyclic condensation skeleton; and a diazo compound moiety,
   wherein said photosensitive material exhibits a light absorbency of not more than 8 per 1 µm when exposed to light having a wavelength of 193 nm;

said alkali-soluble resin moiety is a copolymer comprising a vinyl or acrylic compound having an alicyclic skeleton, or both alicyclic and polycyclic condensation skeleton, and a monomer formed of a compound other than said vinyl or acrylic compound;

said diazo compound moiety is contained integral with said alkali-soluble resin in a ratio of from 30 to 60 wt % based on said alkali-soluble resin; and said alicyclic skeleton is formed of a compound having a substituted or unsubstituted menthyl group.

6. A photosensitive material, which comprises:

an alkali-soluble resin moiety having a polycyclic condensation skeleton, or both alicyclic and polycyclic condensation skeleton; and a diazo compound moiety, wherein said photosensitive material exhibits a light absorbency of not more than 8 per 1 μm when exposed to light having a wavelength of 193 nm;

said alkali-soluble resin moiety is a copolymer comprising a vinyl or acrylic compound having a polycyclic condensation skeleton, or both alicyclic and polycyclic condensation skeleton, and a monomer formed of a compound other than said vinyl or acrylic compound;

said diazo compound moiety is contained integral with said alkali-soluble resin in a ratio of from 30 to 60 wt % based on said alkali-soluble resin; and said polycyclic condensation skeleton is formed of a compound having a substituted or unsubstituted naphthyl group.

7. A method of forming a pattern, which comprises the steps of;

forming an underlying layer of photosensitive material on a substrate;

forming an upper layer of photosensitive material having a structure containing an alicyclic skeleton on said underlying layer of photosensitive material;

selectively exposing a portion of said upper layer of photosensitive material to a first actinic radiation;

developing said upper layer of photosensitive material by dissolving an exposed or unexposed portion with an aqueous alkaline solution to form a patterned upper layer of photosensitive material; and irradiating a second actinic radiation having a wavelength longer than that of said first actinic radiation to said underlying layer of photosensitive material using said pattern as a mask, and developing said underlying layer of photosensitive material by dissolving and removing an exposed portion selectively, thus transcribing said patterned upper layer of photosensitive material to said underlying layer of photosensitive material.

8. The method of forming a pattern according to claim 7, wherein said first actinic radiation to be irradiated to said upper layer of photosensitive material is ArF excimer laser;

said second actinic radiation to be irradiated to said underlying layer of photosensitive material is a light of 200 to 260 nm in wavelength.

9. The method of forming a pattern according to claim 7, wherein said underlying layer of photosensitive material contains a phenol resin.

10. The method of forming a pattern according to claim 7, wherein said alicyclic skeleton is formed of a compound having a substituted or unsubstituted menthyl group.

11. A method of forming a pattern, which comprises the steps of;

forming an underlying layer of photosensitive material on a substrate;

forming an upper layer of photosensitive material having a structure containing an alicyclic skeleton on said underlying layer of photosensitive material;

selectively exposing a portion of said upper layer of photosensitive material to electron beam;

developing said upper layer of photosensitive material by dissolving an exposed or unexposed portion with an aqueous alkaline solution to form a patterned upper layer of photosensitive material; and irradiating a light of 190 to 260 nm in wavelength to said underlying layer of photosensitive material using said pattern as a mask, and developing said underlying layer of photosensitive material by dissolving and removing an exposed portion of said underlying layer of photosensitive material, thus transcribing said patterned upper layer of photosensitive material to said underlying layer of photosensitive material.

12. The method of forming a pattern according to claim 11, wherein said underlying layer of photosensitive material contains acrylic resin having an alicyclic skeleton.

13. The method of forming a pattern according to claim 11, wherein said alicyclic skeleton is formed of a compound having a substituted or unsubstituted menthyl group.

14. A method of forming a pattern, which comprises the steps of;

forming an underlying layer of photosensitive material on a substrate;

forming an upper layer of photosensitive material having a structure containing a substituted or unsubstituted polycyclic condensed aromatic ring on said underlying layer of photosensitive material;

selectively exposing a portion of said upper layer of photosensitive material to a first actinic radiation;

developing said upper layer of photosensitive material by dissolving an exposed or unexposed portion with an aqueous alkaline solution to form a pattered upper layer of photosensitive material; and irradiating a second actinic radiation having a wavelength longer than that of said first actinic radiation to said underlying layer of photosensitive material using said pattern as a mask, and developing said underlying layer of photosensitive material by dissolving and removing an exposed portion selectively, thus transcribing said patterned upper layer of photosensitive material to said underlying layer of photosensitive material.

15. The method of forming a pattern according to claim 14, wherein said first actinic radiation to be irradiated to said upper layer of photosensitive material is ArF excimer laser;

said second actinic radiation to be irradiated to said underlying layer of photosensitive material is a light of 200 to 260 nm in wavelength.

16. The method of forming a pattern according to claim 14, wherein said underlying layer of photosensitive material contains a phenol resin.

17. The method of forming a pattern according to claim 14, wherein said upper layer of photosensitive material comprises a vinyl copolymer containing a substituted or unsubstituted polycyclic condensed aromatic ring.

18. A method of forming a pattern, which comprises the steps of;

forming an underlying layer of photosensitive material on a substrate;

forming an upper layer of photosensitive material having a structure containing a substituted or unsubstituted benzen ring or polycyclic condensed ring on said underlying layer of photosensitive material;

selectively exposing a portion of said upper layer of photosensitive material to electron beam;

developing said upper layer of photosensitive material by dissolving an exposed or unexposed portion with an aqueous alkaline solution to form a patterned upper layer of photosensitive material; and irradiating a light of 190 to 260 nm in wavelength to said underlying layer of photosensitive material using said pattern as a mask, and developing said underlying layer of photosensitive materiel by dissolving and removing an exposed portion of said underlying layer of photosensitive material, thus transcribing said patterned upper layer of photosensitive material to said underlying layer of photosensitive material.

19. The method of forming a pattern according to claim 18, wherein said underlying layer of photosensitive material contains acrylic resin having an alicyclic skeleton.

* * * * *